United States Patent
Hashemi et al.

(10) Patent No.: US 6,674,337 B2
(45) Date of Patent: Jan. 6, 2004

(54) CONCURRENT MULTI-BAND LOW NOISE AMPLIFIER ARCHITECTURE

(75) Inventors: Seyed-Hossein Hashemi, Pasadena, CA (US); Seyed-Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 35 days.

(21) Appl. No.: 09/821,403

(22) Filed: Mar. 28, 2001

(65) Prior Publication Data

US 2002/0030545 A1 Mar. 14, 2002

Related U.S. Application Data

(60) Provisional application No. 60/192,515, filed on Mar. 28, 2000.

(51) Int. Cl.[7] ................................................. H03H 7/38
(52) U.S. Cl. ............................ 333/32; 330/126; 330/302
(58) Field of Search ................................ 330/126, 302; 333/32

(56) References Cited

U.S. PATENT DOCUMENTS

| | | | |
|---|---|---|---|
| 5,592,122 A | * 1/1997 | Masahiro et al. | ............ 330/286 |
| 5,973,568 A | 10/1999 | Shapiro | ........................ 330/295 |
| 5,995,814 A | 11/1999 | Yeh | ........................ 455/180.1 |
| 6,054,902 A | * 4/2000 | Masato | ........................ 330/306 |
| 6,075,996 A | 6/2000 | Srinivas | ........................ 455/552 |
| 6,329,886 B1 | * 12/2001 | Ogoro | ........................ 333/32 |
| 6,384,688 B1 | * 5/2002 | Fujioka et al. | ............... 330/302 |
| 6,392,491 B1 | * 5/2002 | Ohkawa et al. | ............. 330/306 |

FOREIGN PATENT DOCUMENTS

| | | |
|---|---|---|
| DE | 19732459 A1 | 2/1999 |
| DE | 198 38 244 A1 | 2/2000 |
| EP | 0 886 384 A2 | 12/1998 |
| JP | 05037255 | 2/1993 |
| WO | WO 00/76060 | 12/2000 |

OTHER PUBLICATIONS

Search Report for PCT/US01/10487 Dated Feb. 18, 2002 in related PCT filing of pending U.S. application.

K. Fong, *Dual–Band High–Linearity Variable–Gain Low–Noise Amplifiers for Wireless Applications*, ISSCC Digest, TP 13.3, (Feb. 1999).

(List continued on next page.)

*Primary Examiner*—Benny Lee
*Assistant Examiner*—Stephen E. Jones
(74) *Attorney, Agent, or Firm*—Christopher J. Rourk; Akin Gump Strauss Hauer & Feld, LLP

(57) ABSTRACT

The present invention relates to a concurrent multi-band amplifiers and to a monolithic, concurrent multi-band low noise amplifier (LNA). The inventive LNA includes a three-terminal active device, such as a transistor with a characteristic transconductance, $g_m$, disposed on a semiconductor substrate. The active device has a control input terminal, an output terminal, and a current source terminal. The amplifier also includes an input impedance matching network system, $Z_{in}$, and an output load network. $Z_{in}$ simultaneously and independently matches the frequency-dependent input impedance of the three-terminal active device to a predetermined characteristic impedance at two or more discrete frequency bands. The output load network simultaneously provides a voltage gain, $A_v$, to an input signal at the amplifier input at each of the two or more discrete frequency bands.

20 Claims, 12 Drawing Sheets

OTHER PUBLICATIONS

Z. D. Liu, et al., *Dual–Frequency Planer Inverted–F Antenna, IEEE Trans. Ant. Prop.,* vol. 45, No. 10, pp. 1451–1458, (Oct. 1997).

H. Miyake, et. al., *A Miniaturized Monolithic Dual Band Filter Using Ceramic Lamination Technique for Dual Mode Portable Telephones, IEEE MTT–S,* pp. 789–792, (1997.).

D. M. Pozar, et al., *A Dual–Band Circularly Polarized Aperture–Coupled Stacked Microstrip Antenna for Global Positioning Satellite, IEEE Tran. Ant. Prop.,* vol. 45, No. 11, pp 1618–1625, (Nov. 1997).

B. Razavi, *A 900–MHz/1.8–GHz CMOS Transmitter for Dual–Band Applications, IEEE Journal of Solid–State Circuits,* vol. 35, No. 5 (May 1999).

J. Ryynänen, et. al., *A Dual–band RF Front–End for WCDMA and GSM Applications, CICC Digest of Technical Papers,* pp. 175–178, (May 2000).

H. Samavati, et al., *A 5–GHz CMOS Wireless LAN Receiver Front End, IEEE JSSC,* vol. 35, No. 5, pp. 765–772, (May 2000).

D. K. Shaeffer, et al., *A 1.5–v, 1.5–GHz CMOS Low Noise Amplifier, IEEE JSSC,* vol. 32, No. 5, pp. 745–759 (May 1997).

D. K. Weaver, *A Third Method of Generation and Detection of Single–Sided Signals, Proc. IRE,* vol. 44, pp. 1703–1705, (Dec. 1956).

S. Wu. et al., FA 8.2: *A 900MHz/1.8GHz CMOS Receiver for Dual Band Applications, ISSCC Digest,* pp. 8.2–1–8.2–8, (Feb. 1998).

Devlin, Liam, *Mixers,* Plextex Communications Technology Consultants, London Road, Great Chesterford, Essex, Apr. 5, 2000.

Hashemi et al., *Concurrent Dual–Band CMOS Low Noise Amplifiers and Receiver Architectures,* Department of Electrical Engineering, California Institute of Technology, Pasadena, CA, USA, Jun. 2001.

Montemayor, Raymond et al., *A Self Calibrating 900–MHz CMOS Image Reject Receiver,* Electrical Engineering Department, University of California, Los Angeles, Ca, Sep. 19, 2000.

Rudell, Jacques C. et al., *Recent Developments in High Integration Multi–Standard CMOS Transceivers for Personal Communication Systems,* Department of Electrical Engineering and Computer Sciences, University of California at Berkeley, CA, (1998).

Crols et al., *A Single–Chip 900 MHz CMOS Receiver Front–End With a High Performance Low–IF Topology, IEEE Journal of Solid–State Circuits,* vol. 30, No. 12, pp. 1483–1492 (Dec. 1995).

Henderson et al., *Image–Reject and Sigle–Sideband Mixers, WJ Tech Notes,* Watkins–Johnson Company, vol. 12, No. 3 (May–Jun. 1985, revised and reprinted 2001).

Wu et al., *A 900–MHz/1.8–GHz CMOS Receiver for Dual-band Applications, 1998 IEEE Journal of Solid State Circuits,* vol. 33, No. 12, pp. 2178–2185(Dec. 1998).

\* cited by examiner

CONCURRENT MULTI-BAND LOW NOISE AMPLIFIER ARCHITECTURE

CROSS-REFERENCE TO RELATED APPLICATION

This application claims the benefit of U.S. Provisional Application No. 60/192,515, filed Mar. 28, 2000.

FIELD OF THE INVENTION

This invention relates to the field of radio frequency ("RF") transceivers and more particularly to monolithic low noise amplifier architectures used in wireless receivers that can operate at multiple frequency bands simultaneously.

BACKGROUND OF THE INVENTION

Wireless communications systems have exhibited remarkable growth over the past decade. Wireless voice and data applications are being enabled by rapidly emerging wireless technologies, such as cellular telephony, personal communications systems and wireless local area networks (WLAN's), to name a few. Digital modulation techniques, miniaturization of transceivers due to advances in monolithic integrated circuit designs and the development of high frequency, microwave and millimeter wave RF systems in both the licensed and unlicensed bands, have all contributed to improving the quality and bandwidth capacity of these system and to reducing the size and costs of the components.

These systems are having a profound effect on societies. For example, they are enabling many work forces in our global, service and information based economy to become "untethered" from their information sources and conventional wired communications mechanisms. Moreover, wireless communication systems are enabling developing countries to provide instant telephone service to new subscribers who otherwise would have to wait years for wireline access.

While many wireless applications work fairly well and have found widespread acceptance (e.g. mobile/cellular telephones), they continue to suffer from numerous drawbacks. One recognized problem in the cellular phone industry is the lack of universal standards for both signal transmission modes (analog or digital) and within digital mode the frequency bands and signal processing protocols (e.g., TDMA, CDMA, WDM, GSM, etc.). This unfortunately requires users who wish to use cell phones in different geographic areas that employ different telecommunications standards to either carry multiple telephones or to use phones designed to operate in multiple frequency modes and bands.

It would thus be highly desirable to have a receiver that can operate at multiple and discrete frequency bands. This would offer several benefits. A multi-band receiver could enable the design of a single device that can operate under multiple standards, such as GSM (with a center frequency of 900 MHz) and DECT (center frequency of 1800 MHz), thereby eliminating the need for one device per standard. While dual band receivers have been introduced that indeed increase the functionality of such communication systems, such receivers switch between two different bands and can receive only one band at a time. FIG. 1 is a schematic of such a conventional dual band architecture. As seen, an incoming signal, $V_{in}$, is received at a switch 10 (for simplicity the antenna and filter are not shown). If the signal is in a first predetermined frequency band, $\omega_1$, the switch moves to the top signal processing path tuned to match and amplify signals only in this band. The signal is then impedance matched and amplified at low noise amplifier ("LNA") 20, mixed with local oscillator, LO1, at mixer 22, filtered at band pass filter 24 and mixed again with local oscillator, LO2, 26, until is exits as $V_{out}$ for further processing (e.g. digital signal processing). Similarly, if the incoming signal is in the second predetermined frequency band, $\omega_2$, the switch moves to the bottom signal processing path tuned to match and amplify signals only in this band, through LNA 30, mixer 32, BPF 34 and mixer 36 and again exists as Vout. The frequency of LO1 is $(\omega_1+\omega_2)/2$ and the frequency of LO2 is $(\omega_1-\omega_2)/2$. While this functionality adds to a device's versatility, such as in the case of a dual-band digital cellular phone, these receivers are more costly than single band receivers and they are not sufficient for the next-generation of multi-functional devices, such as a cell phone with a GPS receiver and a bluetooth interface.

Another problem with conventional wireless technology relates to bandwidth limitations. The diverse range of modem wireless applications demand wireless communications systems and transceivers with greater bandwidth capacity and flexibility than can be currently supplied. Increased bandwidth capacity is necessary for many wireless applications to become a reality. Wireless broadband Internet applications (e.g. browsing, e-commerce, streaming audio and video), wireless video messaging, wireless video games, and remote video monitoring are just a few examples of applications that will be delivered over the next generations of wireless networks. Conventional solid-state RF, or wireless, receiver architectures, such as superheterodyne and direct conversion receivers, accomplish high selectivity and sensitivity by designing them for narrow-band operation at a single RF frequency. Unfortunately, these modes of operation are of limited functionality because they limit the system's available bandwidth and robustness to channel variations. On the other hand, wide-band modes of operation are more sensitive to out-of-band signals due to transistor non-linearity, which can introduce severe bottlenecks in system performance.

It would thus be highly desirable to have such a low cost, concurrent multi-band receiver. As used herein a concurrent multi-band receiver is one that can process signals at multiple and discrete frequency bands simultaneously. This would enable a single path receiver to significantly increase its bandwidth capacity (bit rate). A concurrent multi-band receiver design could also be used for supplying redundancy in mission critical data transmission application. The reliability of the received signal would be greatly increased with simultaneous transmission of the same signal in multiple bands for diversity of signal.

Using conventional receiver technology, the only way to theoretically provide concurrent multi-band functionality is to design into a receiver multiple independent signal paths with multiple sets of components (antennas, LNA's, downconverter etc.). Such a dual-band receiver is shown schematically in FIG. 2. As shown, this design is similar to the dual band receiver in FIG. 1 without the switch 12 and separate outputs, $V_{out1}$ and $V_{out2}$. This scheme essentially equivalent to designing multiple single band receivers, each tuned to a different band and stuffed into one package. Unfortunately, this architecture significantly increases the cost, footprint and power dissipation of a receiver, and tends to make such solutions impractical, at least for commercial applications. Thus, a challenge for modern receiver design is to create concurrent multi-band functionality using as little real estate (and ideally monolithically) and as little power dissipation as possible (and perhaps no more than single band receivers), while keeping the incremental production costs above the conventional single band receiver to a minimum.

The LNA is a critical front end component of a wireless receiver. Its function is to take the relatively weak signal received at the antenna and, after filtering, amplify it with maximum power transfer and with a minimum added noise for further processing (downconversion, etc.). The maximum power transfer is achieved by designing the LNA to have an input impedance that matches a characteristic input impedance of the antenna, which is commonly 50 ohms. Thus, a true concurrent multi-band LNA, as a critical front end component of a concurrent multi-band receiver, must be capable of (1) matching the characteristic input impedance of the received signal at the antenna at the multiple frequency bands, simultaneously; (2) simultaneously amplifing the received signal(s) at each of the bands; and (3) accomplishing the above with minimum electrical noise added.

As in the case of conventional dual band receivers described above, in conventional dual-band LNA's, for example, either one of two single-band LNA's is selected according to the instantaneous band of operation, or two single-band LNA's are designed to work in parallel using two separate input matching circuitry and two separate resonant loads. The former approach is non-concurrent, while the latter consumes twice as much power. The other existing approach is to use a wide-band amplifier in the front end. Unfortunately, in a wide-band LNA, strong unwanted blockers are amplified together with the desired frequency bands and significantly degrade the receiver sensitivity. Thus, a definite need exists for a concurrent multi-band LNA that eliminates these problems.

SUMMARY OF THE INVENTION

The present invention, which addresses these needs, resides in a concurrent, multi-band amplifier architecture that is capable of simultaneous operation at two or more different frequencies without dissipating twice (or more) as much power or a significant increase in cost and footprint. This concurrent operation can be used to extend the available bandwidth, provide new functionality and/or add diversity to battle channel fading. These new concurrent multi-band amplifiers, which in one aspect of the invention are LNA'S, LNA's provide simultaneous narrow-band gain and matching at multiple frequency bands.

The present invention relates to a concurrent multi-band amplifier having an input and output. The inventive amplifier includes a three-terminal active device, such as a transistor with a characteristic transconductance, $g_m$, disposed on a semiconductor substrate. The active device has a control input terminal, an output terminal, and a current source terminal. The amplifier also includes an input impedance matching network system, $Z_{in}$, and an output load network. $Z_{in}$ simultaneously and independently matches the frequency-dependent input impedance of the three-terminal active device to a predetermined characteristic impedance at two or more discrete frequency bands. The output load network simultaneously provides a voltage gain, $A_v$, to an input signal at the amplifier input at each of the two or more discrete frequency bands.

The present invention also resides in a monolithic, concurrent multi-band LNA having essentially the same three components as described above. In the LNA embodiment, however, in addition to simultaneously and independently matching the frequency-dependent input impedance of the three-terminal active device to a predetermined characteristic impedance at two or more discrete frequency bands, $Z_{in}$ is also designed to minimize the noise associated with the active device.

The input impedance matching network system of the multi-band LNA is defined by the equation, $Z_{in}=Z_1+Z_2+Z_3+Z_4+Z_5$. These five variables represent two-terminal frequency-dependent, impedance networks. In particular, $Z_1$ is disposed between the input of the active device and ac-ground and is defined by the equation $Z_1=Z_g+Z_{gs}+Z'_s+g_mZ'_sZ_{gs}$, wherein $Z_g$ is a series impedance disposed between the LNA input and the control input terminal of the active device, $Z_{gs}$ is the impedance between the control input and current source terminals and $Z'_s$ is the sum of the impedance between the current source terminal of the active device and ac-ground, $Z_s$, and the intrinsic current source-to-bulk impedance, $Z_{bs}$.

$Z_2$ is a second two-terminal, frequency-dependent, impedance network disposed between the input of the active device and ac-ground and defined by the equation $Z_2=Z'_L+Z_f$, wherein $Z'_L$ is the sum of the load impedance between the output and ac-ground, $Z_L$, and the intrinsic output terminal-to-bulk impedance, $Z_{bd}$, and $Z_f$ is the feedback between the output terminal and control input terminal. $Z_3$ is a third two-terminal, frequency-dependent, impedance network disposed between the input of the active device and ac-ground and defined by the equation $Z_3=[1+Z_f/Z'_L]/g_{mb}$, wherein $g_{mb}$ is the bulk effect transconductance.

$Z_4$ is a fourth two-terminal, frequency-dependent, impedance network disposed between the input of the active device and ac-ground and defined by the equation This equation for $Z_{in}$ is a very broad implementation of the impedance matching network of the present invention.

$$Z_4 = \frac{1}{g_m - g_{mb}} \cdot \left(\frac{Z_f}{Z'_L}\right) \cdot \frac{Z_{gs} + Z'_s(1 + g_m Z_{gs})}{Z_{gs}};$$

and $Z_5$ is a fifth two-terminal, frequency-dependent impedance network disposed between the input of the active device and ac-ground, which is the intrinsic control terminal-to-bulk impedance, $Z_{gb}$.

In a more specific embodiment of the multi-band LNA, $Z_f$ and $Z_{gb}$ are neglected, thereby simplifying the input impedance matching network system to $Z_{in}=Z_1$. Moreover, the LNA has a characteristic noise factor, F, approximated by the equation $$F \approx 1 + \frac{\gamma g_{d0}}{Y_s} \cdot \frac{1}{g_m^2|Z_{gs}|^2} \cdot |1 + Y_s(Z_{gs} + Z'_s + Z_g)|^2.$$

Using these formulas, $Z_{in}$ is matched to the predetermined characteristic impedance and F is minimized by setting $Z_{gs}+Z'_s+Z_g=0$ for the center frequency of each of the two or more discrete frequency bands. In a specific embodiment, and as is typical in the RF industry, the predetermined characteristic impedance is equal to 50 ohms. Thus, $g_mZ'_sZ_{gs}$ equals 50 ohms.

Turning to the output load network of the LNA of present invention, the voltage gain, Av, is defined by the equation $Av=-Z_L/Z'_s$. More particularly, the output load network is a multi-resonant load circuit disposed between the output of the three-terminal device and ac-ground that provides the voltage gain of the device at each of the discrete frequency band.

As a specific embodiment of the present invention, a monolithic, concurrent dual-band LNA having an input and output is disclosed. The input impedance matching network system, $Z_{in}$, associated with the three terminal active device simultaneously and independently matches the frequency-dependent input impedance of the active device to a predetermined characteristic impedance at two discrete frequency bands, and is defined by the equation: $Z_{in}=Z_g+Z_{gs}+Z'_s+g_mZ'_sZ_{gs}$. As above, this dual band LNA sets $Z_g+Z_{gs}+Z'_s=0$ for each of the two frequency bands, thereby making $g_m Z'_s Z_{gs}$ equal to the predetermined characteristic impedance, which preferably is 50 ohms.

As one implementation of this dual band topology, $Z_g$ is a parallel LC network wire bonded to the input of the three terminal device and $Z'_s$ is an inductor. Moreover, the LNA includes an output load network, $Z_L$, that simultaneously provides a voltage gain, $A_v$, to an input signal at the LNA input at each of the two discrete frequency bands. This load network, $Z_L$, is a series LC branch in parallel with a parallel LC tank.

The inventors have designed a concurrent dual band CMOS LNA, having an input and an output that operates simultaneously at 2.45 GHz and 5.25 GHz center frequency bands. The input impedance network, $Z_{in}$, simultaneously and independently matches the frequency-dependent input impedance of the transistor to a 50 ohm characteristic impedance at center frequencies of 2.45 GHz and 5.25 GHz, and is defined by the equations: $Z_{in}=Z_g+Z_{gs}+Z'_s+g_mZ'_sZ_{gs}=$ 50 Ω and $Z_g+Z_{gs}+Z'_s=0$. In particular, $Z_g$ is an input parallel resonator having a capacitor in parallel with an inductor, disposed between the LNA input and gate and with a wire bonded to the gate, $Z_{gs}$ is the impedance between the gate and source, and $Z'_s$ is an inductor disposed between the source and AC ground. The input parallel resonator is an approximately 0.9 pF capacitor in parallel with an approximately 2.7 nH inductor with the wire boding having an approximate inductance value of 3 nH, $Z'_s$ is an approximately 0.7 nH inductor, the series LC branch circuit is an approximately 240 fF capacitor in series with an approximately 9.8 nH inductor, and the parallel LC tank circuit is an approximately 2.3 nH inductor in parallel with the inherent parasitic inductance of the active device. Moreover, the output load network, $Z_L$, that simultaneously provides a voltage gain, $A_v$, to an input signal at the LNA input at the 2.45 GHz and 5.25 GHz center frequencies, wherein the output load network, $Z_L$, is a series LC branch circuit, in parallel with a parallel LC tank circuit.

A method of concurrently amplifying a multi-band input signal on a semiconductor substrate having a monolithic, three-terminal active device is also described. The method includes simultaneously and independently matching the frequency dependent, input impedance of the three terminal active device to a predetermined characteristic input impedance at two or more discrete frequency bands, and simultaneously providing a voltage gain to the input signal at each of the two or more discrete frequency bands. The method further simultaneously minimizes the noise associated with of the impedance-matched input signal at each of the two or more discrete frequency bands.

Other features and advantages of the present invention should become more apparent from the following description of the preferred embodiments, taken in conjunction with the accompanying drawings, which illustrate, by way of example, the principles of the invention.

DETAILED DESCRIPTION OF THE PREFERRED EMBODIMENTS

The invention summarized above and defined by the enumerated claims may be better understood by referring to the following detailed description, which should be read in conjunction with the accompanying drawings. This detailed description of particular preferred embodiments, set out below to enable one to build and use particular implementations of the invention, is not intended to limit the enumerated claims, but to serve as particular examples thereof. The particular examples set out below are the preferred specific implementations of a monolithic, concurrent multi-band LNA and method for designing the same. It should be understood however, that this system and technique is not limited to LNA's. The concurrent multi-band matching and gain techniques described herein may also be used to design other types of amplifiers and active filters. All are intended to fall within the scope of this invention.

As in all receivers, the first gain stage in a concurrent multi-band receiver is its LNA. Traditional single-band LNA's use a single or cascode transistor stage to provide wide-band transconductance and combine it with proper passive resonant circuitry at the input and output to shape the frequency response and achieve gain and matching at the single band of interest. See e.g., Shaffer et al., "A 1.5-V, 1.5 GHz CMOS Low Noise Amplifier," *IEEE JSSC*, vol. 32. No. 5, pp. 745–59, May 1977. The inventors have observed that the wide-band transconductance of the active device can be used to provide gain and matching at other frequencies of interest without any penalty in power dissipation. This observation has led the inventors to a compact and efficient front-end for a concurrent dual-band receiver which consists of a dual-band antenna, followed by a monolithic dual-band filter, and the concurrent dual-band LNA of the present invention that provides simultaneous gain and matching at two bands.

Figure 1:
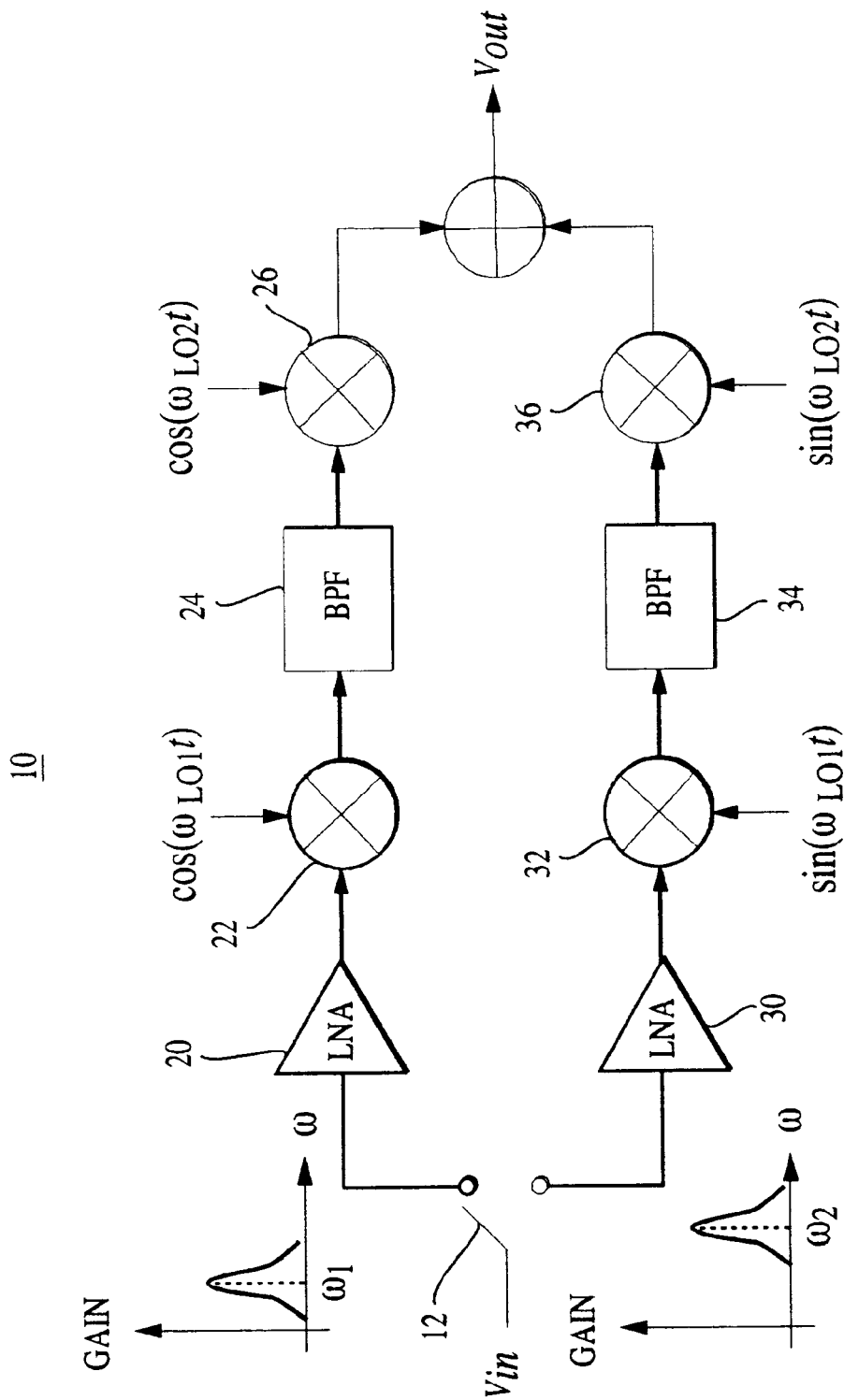
FIG. 1 is a schematic diagram of a conventional dual-band receiver architecture that switches from band to band.
Figure 2:
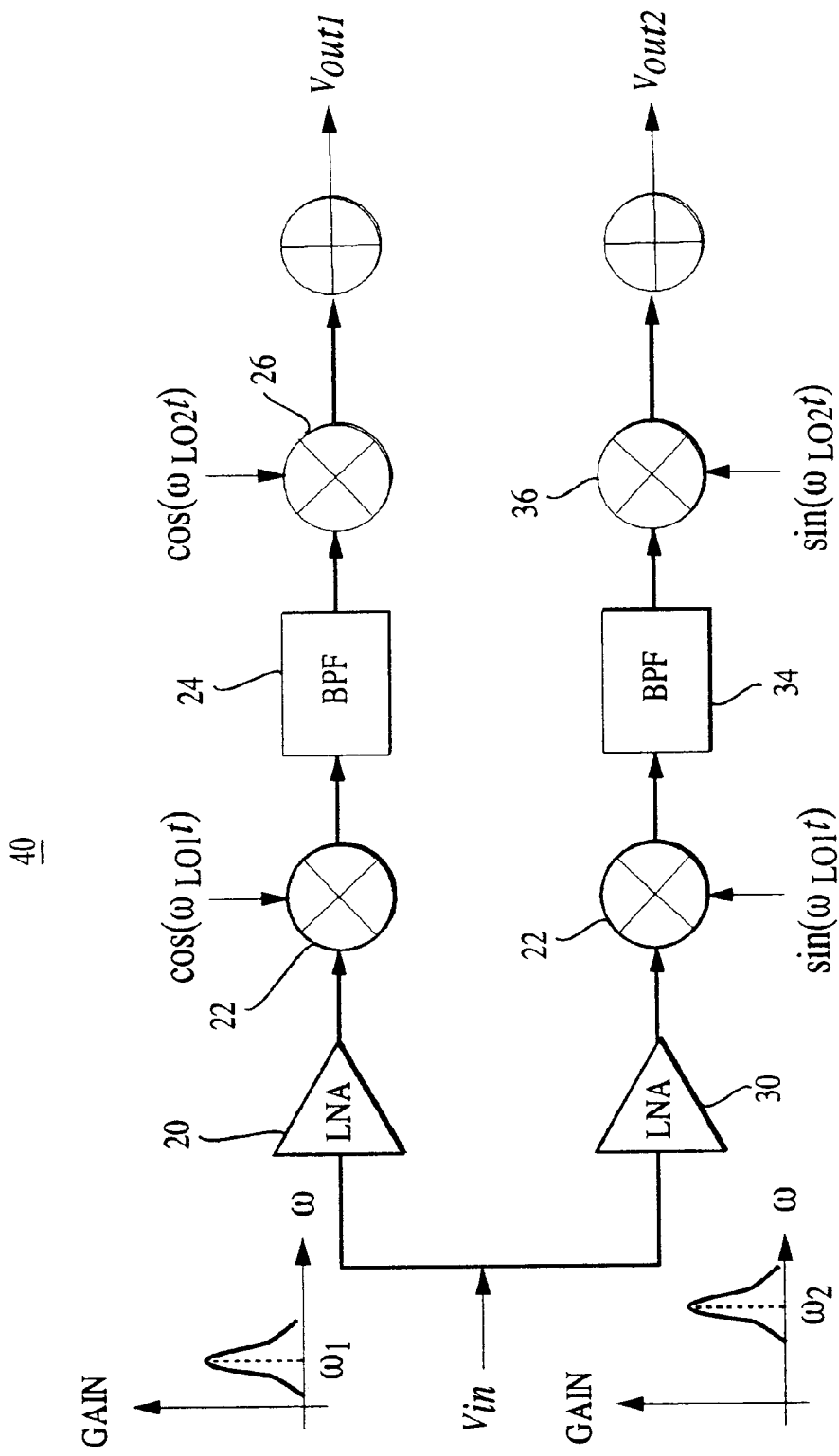
FIG. 2 is a schematic diagram of a prior art dual band receiver architecture with multiple independent signal paths.
Figure 3:
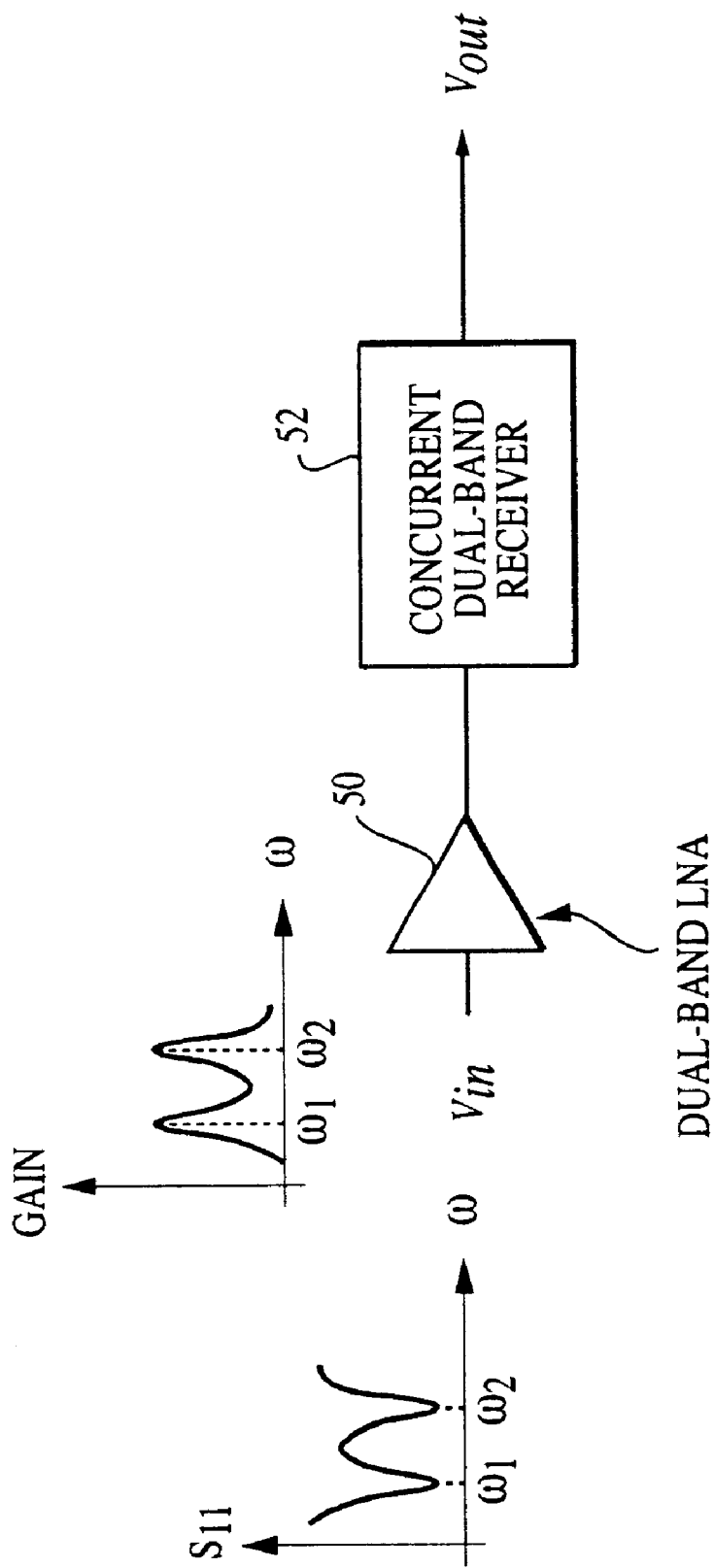
FIG. 3 is a schematic diagram of a concurrent, single path dual-band receiver using the concurrent dual band LNA architecture of the present invention.

The present invention provides a generic approach to the design of a general class of integrated, single path concurrent multi-band LNA's as one of the essential building blocks of concurrent multi-band receivers. FIG. 3 is a conceptual schematic of such a true concurrent dual-band receiver. An incoming signal $V_{in}$ containing information at two discrete frequency bands ω1 and ω2 is amplified simultaneously at those frequencies (see gain v. frequency chart) and impedance matched simultaneously at those frequencies (see $S_{11}$ v. frequency chart) by a dual band LNA 50 of the present invention. The amplified signal is then further processed by the remaining dual band components and circuitry of the receiver 52.

In a single-band LNA, passive circuits are used to shape the wideband transconductance of the active device in the frequency domain to achieve gain and matching at the frequency of interest. This concept can be generalized to multiple frequency bands noting that the intrinsic transconductance of the active device is inherently wideband and can be used at multiple frequencies simultaneously.

Figure 4:
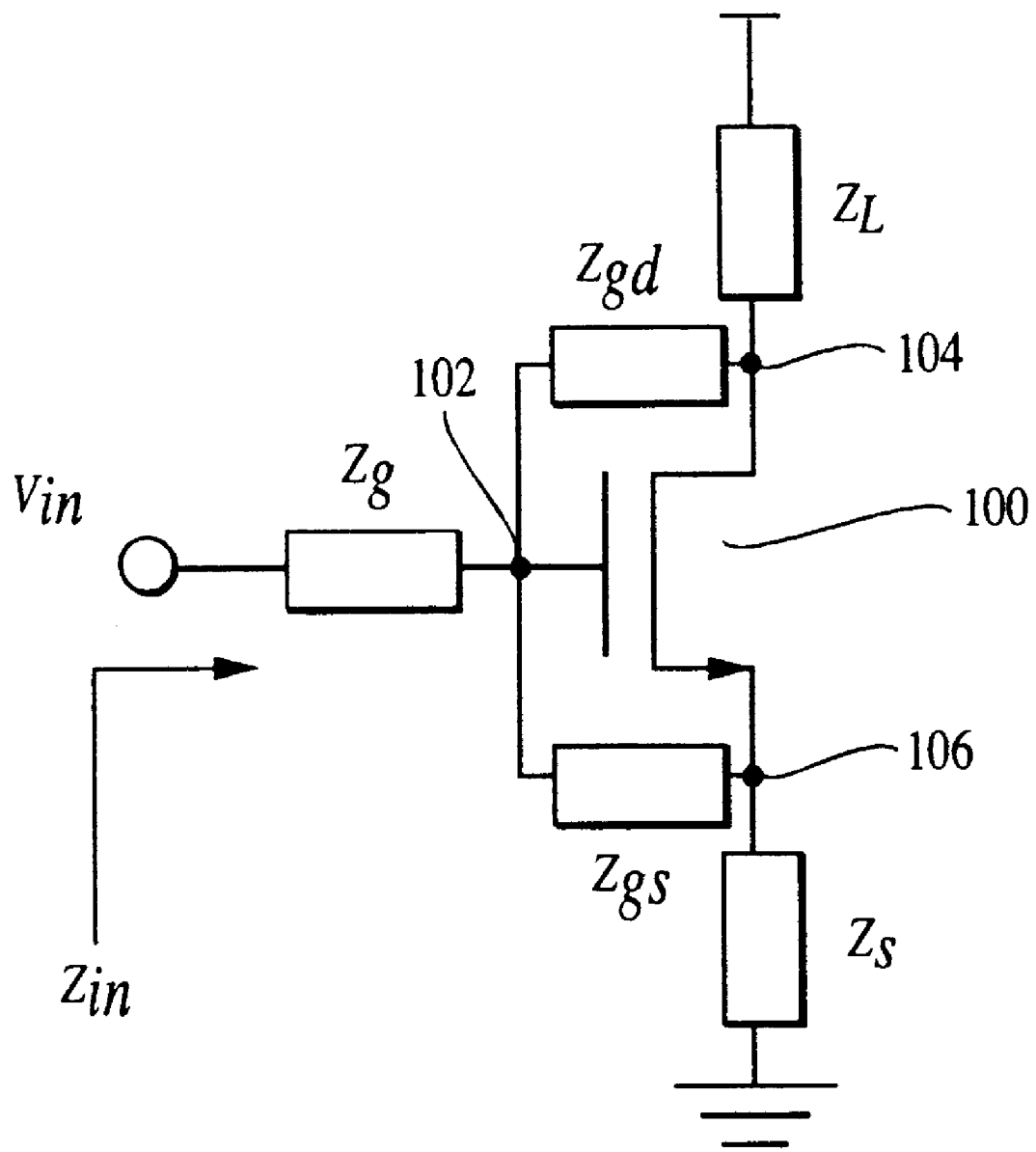
FIG. 4 is a general impedance model for a single transistor amplifier

FIG. 4 shows the general case impedance model of a three terminal active device having an input terminal, an output terminal and a current source terminal. The active device shown here is an NFET transistor having a gate 102, g, as its input terminal, a drain 104, d, as its output terminal, and a source 106, s, as its current source terminal. The transistor and impedance terminology and symbology used hereinafter follow the FET transistor convention. However, it should be understood that this general case and the specific examples set forth hereinafter apply equally to other types of three terminal active devices, such as bipolar, MESFET, PHEMT transistors, etc.

Figure 5:
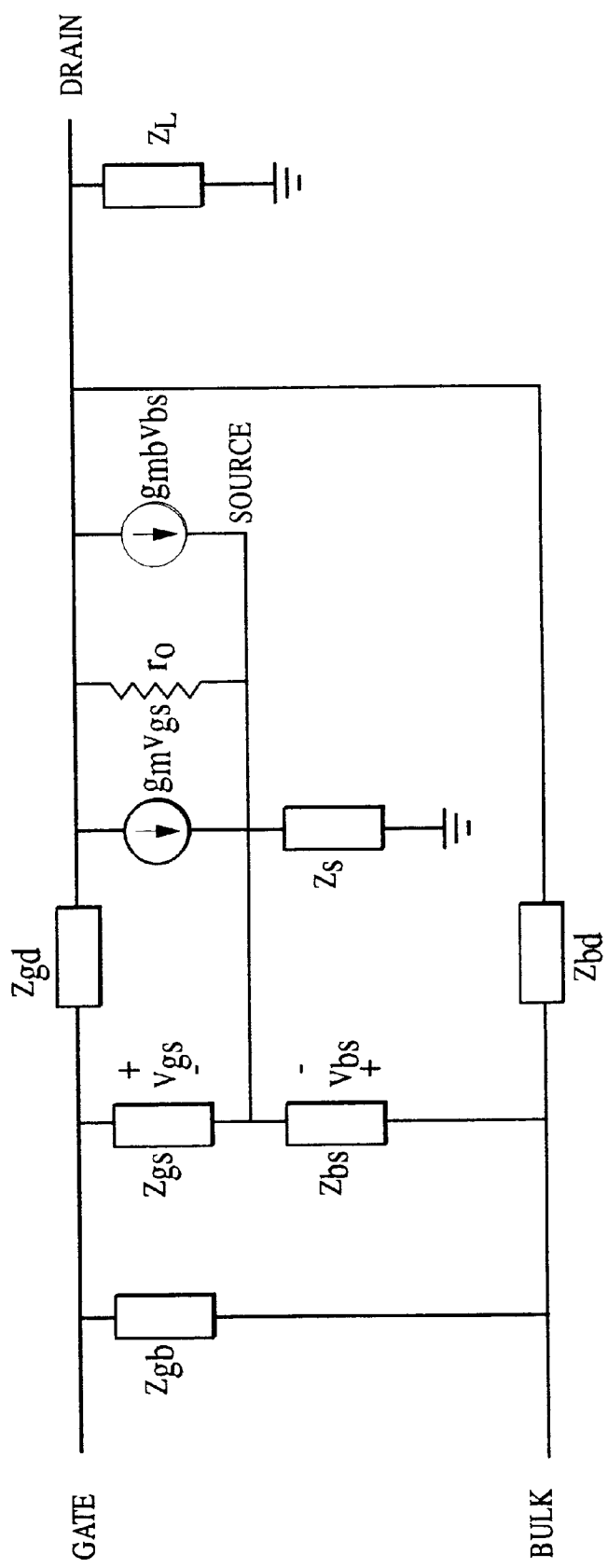
FIG. 5 is the general impedance model of the transistor amplifier shown in FIG. 4, with the transistor shown as a combination of impedance and voltage dependent current sources.
Figure 6:
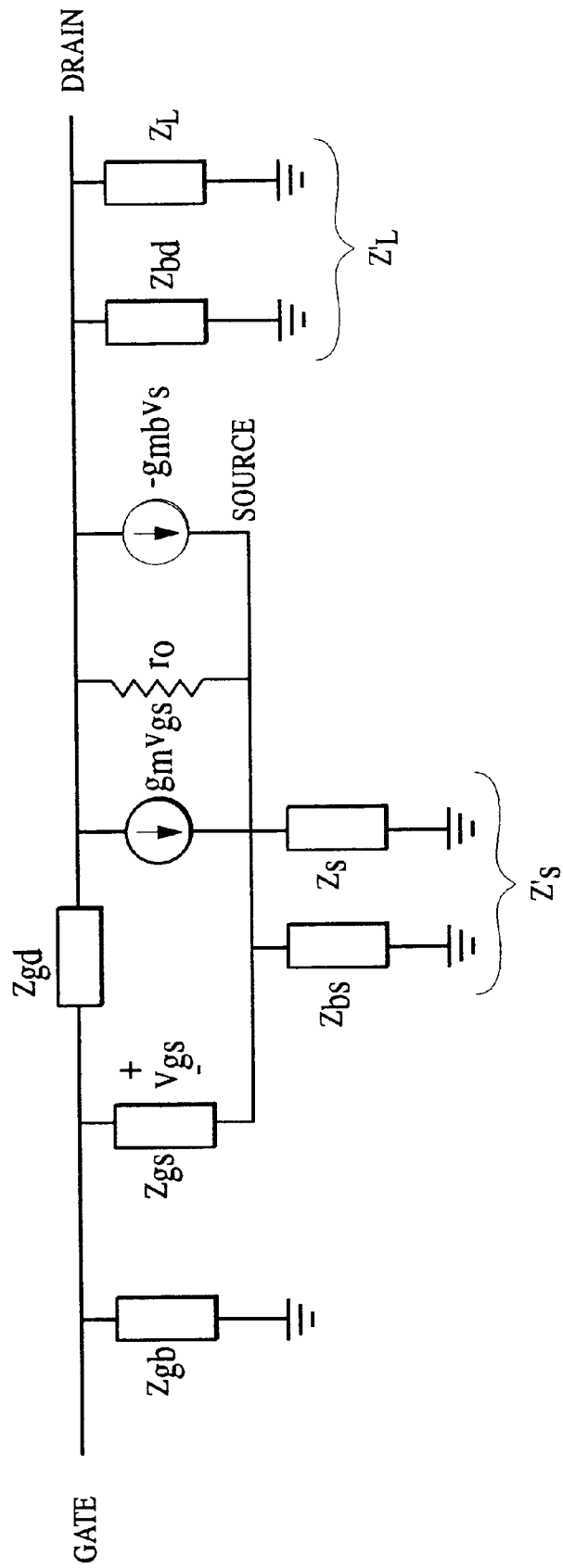
FIG. 6 is the active device general model of FIG. 5 with the active device (transistor) disposed on a bulk substrate, and further showing the terminal to bulk impedances.

This general model shows an LNA input signal, $V_{in}$, with an arbitrary series impedance between the incoming input signal and the gate, $Z_g$, a gate-source impedance, $Z_{gs}$, a source impedance $Z_s$, a gate-drain impedance $Z_{gd}$, (also known as the feedback impedance $Z_f$) and a load impedance $Z_L$. The impedances shown in FIG. 4 also include transistor's inherent reactance components (e.g., $C_{gs}$). This model is redrawn in FIG. 5 with the transistor shown as a combination of current sources and a drain-to-source resistance, $r_0$, and disposed on silicon substrate bulk, b, with the added impedances introduced from each transistor terminal to the bulk, namely, $Z_{gb}$, $Z_{bs}$, and $Z_{bd}$. FIG. 6 is the same as FIG. 5 but with the bulk set to AC ground. As noticed in FIG. 6, the bulk-to-source impedance, $Z_{bs}$, can be combined with the source impedance $Z_s$ to result in $Z'_s$. Further, the bulk-to-drain impedance, $Z_{bd}$, can be combined with the externally added load impedance $Z_L$ resulting in $Z'_L$.

The three primary design considerations for the concurrent multi-band LNA of the present invention are (1) input impedance matching; (2) noise factor minimization; and (3) output gain. Each of these are now considered in detail.

1. Multiband Input Impedance Matching

An important feature of an LNA is its input impedance matching for maximum power transfer. Neglecting $r_0$ shown in FIG. 6, the input admittance (inverse of impedance) looking into the gate of the transistor, has been derived by the inventors and is given by the equation:

$$Y_{in} = \frac{1}{Z_g + Z_{gs} + Z'_s(1 + g_m Z_{gs})} + \frac{1}{Z'_L + Z_f} + \frac{\frac{g_{mb}}{1 + \frac{Z_f}{Z'_L}} + \frac{1}{1 + \frac{Z_f}{Z'_L}} \times (g_m - g_{mb}) \times \frac{Z_{gs}}{Z_{gs} + Z'_s(1 + g_m Z_{gs})}}{} \quad \text{Eq. (1)}$$

Figure 7:
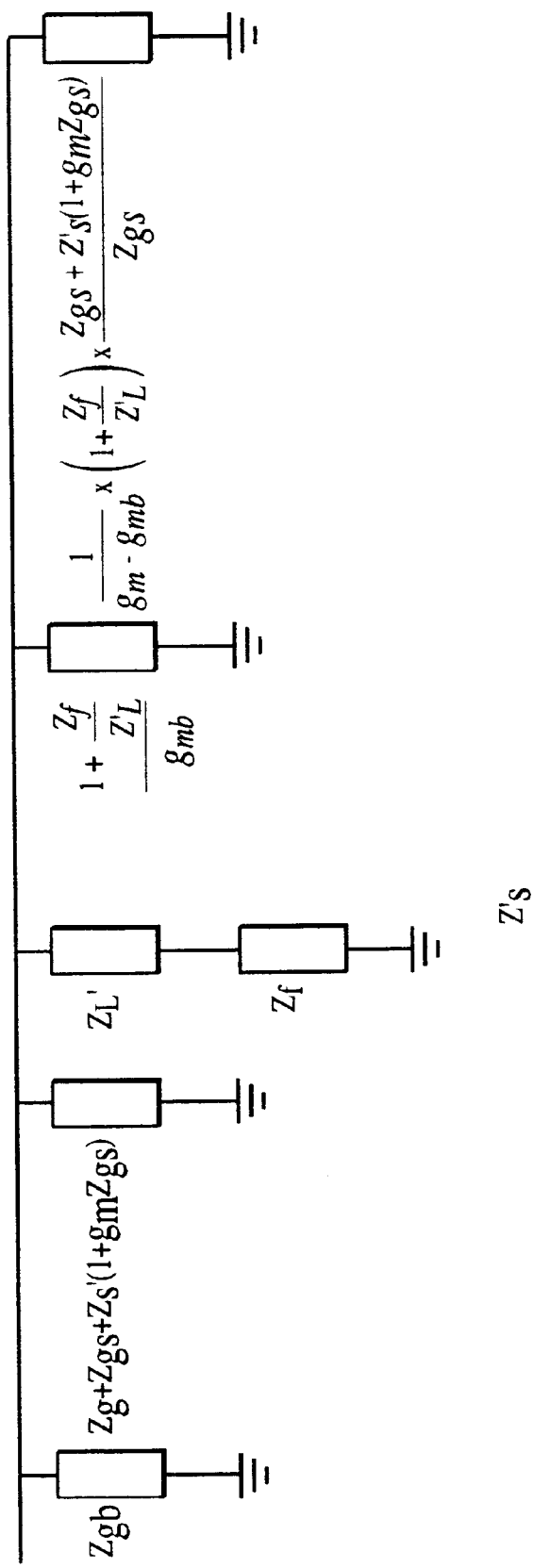
FIG. 7 is an input impedance network system schematic of the present invention showing the input impedances of the amplifier looking into the gate of the transistor.

For purposes of impedance matching, the inventors have designed the broad schematic shown in FIG. 7 showing the input impedance of the LNA looking into the gate of the transistor. Converting FIG. 7 to an equation, the input impedance can be defined as the sum of five, two-terminal, frequency-dependent, impedance networks:

$$Z_{in} = Z_1 + Z_2 + Z_3 + Z_4 + Z_5 \quad \text{Eq. (2)}$$

wherein $Z_1 = Z_g + Z_{gs} + Z'_s + g_m Z'_s Z_{gs}$;

$Z_2 = Z'_L + Z_f$;

$Z_3[1 + Z_f/Z'_L]/g_{mb}$, wherein $g_{mb}$ is the bulk effect transconductance;

$$Z_4 = \frac{1}{g_m - g_{mb}} \cdot \left(\frac{Z_f}{Z'_L}\right) \cdot \frac{Z_{gs} + Z'_s(1 + g_m Z_{gs})}{Z_{gs}}; \text{ and}$$

$Z_5$ is the intrinsic gate-to-bulk impedance, $Z_{gb}$.

Further, neglecting the effect of the gate-to-drain impedance $Z_{gd}$ ($Z_f$), that is to say, assuming the transistor's internal reactance $C_{gd}$ approximates 0 (compared to the other impedances in the network), as well as $Z_{gb}$, the input impedance of the amplifier shown in FIGS. 3–7 is simplified to $$Z_{in} = Z_1 = Z_g + Z_{gs} + Z'_s(1 + g_m Z_{gs}) \quad \text{Eq. (3)}.$$

To achieve a maximum input power match at more than one frequency band simultaneously, the inventors have determined that Equation 3 should satisfy the following equation set:

$$Z_g + Z_{gs} + Z'_s = 0 \quad \text{Eq. (4)}$$

and thus, $$g_m Z'_s Z_{gs} = Z_{in} = R_{in} = 50 \ \Omega, \quad \text{Eq. (5)}.$$

wherein $R_{in} = 50 \ \Omega$ is the predetermined characteristic impedance of the antenna. It should be understood that any other antenna design having a different impedance value could be used. However, as is well understood, 50 Ω has become a de facto standard in antenna receiver design.

To demonstrate the validity of these expressions, consider the special case of a single band LNA inductive source degeneration similar to that of Shaffer et al., discussed above, where (4) reduces to:

$$\begin{cases} (L_g + L_s) C_{gs} \varpi^2 = 1 \\ \frac{g_m L_s}{C_{gs}} = R_{in} = 50 \Omega \end{cases}$$

in accordance with Shaffer et al.

The general design criteria given by Eq. (4) can be used to generate a large number of different topologies for concurrent multi-band LNAs. The section titled "Examples" below presents just two examples of such topologies, one for a dual-band LNA and another for a triple-band LNA.

2. Noise Factor

Ignoring the noise contribution of passive elements, the total noise of an LNA can be represented by its input equivalent voltage and current noise:

$$i_n = \frac{i_{nd}}{g_m Z_{gs}} + i_{ng} \quad \text{Eq. (6)}$$

-continued $$e_n = \frac{Z_{gs} + Z'_s + Z_g}{g_m Z_{gs}} \cdot i_{nd} + (Z'_s + Z_g) \cdot i_{ng}.$$

where $i_{nd}$ and $i_{ng}$ are the drain and gate noise currents (collector and base noise currents in a bipolar implementation), and $g_m$ is the transconductance of the transistor.

To obtain more insight into the design trade-offs, the inventors of the present invention ignored the gate noise (that usually contributes less than 0.2 dB to the NF), in the expression for the noise factor, F, that is given by:

$$F = 1 + \frac{\overline{|i_n + Y_s e_n|^2}}{\overline{i_s^2}} \qquad \text{Eq. (7)}$$

$$\approx 1 + \frac{\gamma g_{d0}}{Y_s} \cdot \frac{1}{g_m^2 |Z_{gs}|^2} \cdot |1 + Y_s(Z_{gs} + Z_s + Z_g)|^2$$

where $g_{d0}$ is the zero-bias drain-source channel conductance, $Y_s$ is the reference source admittance (e.g., $Y_s = 1/50 \, \Omega$) for the noise figure, NF, $i_s$ is the noise current associated with this source admittance, and $\gamma$ is the excess noise factor for the MOS transistor ranging from 2/3 for long-channel devices to more than 2 for short-channel devices.

Several useful design implications can be obtained from Eq. (7). First of all, this equation agrees with the well-accepted notion that NF can be reduced using a larger $g_m$ (more power dissipation). It also shows that an increase in $Z_{gs}$ improves the NF, that accounts for the improvement in noise figure for transistors with smaller channel length and $C_{gs}$. The last term in Eq. (7) plays the most important role in the design of concurrent multi-band LNA's. Since passive components cannot produce any negative real part, the last term reaches its minimum when $Z_g + Z_{gs} + Z'_s = 0$ at the frequency(ies) of interest. Thus, the minimum NF will be achieved for these frequency(ies).

It is thus observed that in order to achieve both minimal noise and maximum power match at the input for multiple frequencies, equations (3) and (7) should simultaneously satisfy the minimum NF and input matching condition at all frequencies of interest. Interestingly, equations (4) and (5) do just that. In addition to these conditions, it is crucial to maximize $Z_{gs}$ and $g_m$ to minimize NF as much as the power budget allows.

3. Narrow Band Output Gain

In order to achieve narrow-band gain at the bands of interest, the drain load network should exhibit high impedance only at those frequencies of interest. Using the model of FIGS. 4–7, the overall gate to drain voltage gain, Av, (neglecting the body effect and r0) is given by the equation:

$$A_V = \frac{Z_L Z_f}{Z_L + Z_f} \cdot \left[ \frac{1}{Z_f} - \frac{g_m Z_{gs}}{Z_{gs} + Z'_s(1 + g_m Z_{gs})} \right]. \qquad \text{Eq. (8)}$$

Again neglecting the feedback impedance $Z_f$, (i.e. $Z_f \approx \infty$) we obtain:

$$A_V = Z'_L \cdot \left[ -\frac{g_m Z_{gs}}{Z_{gs} + Z'_s + g_m Z'_s Z_{gs}} \right]. \qquad \text{Eq. (9)}$$

Applying the parameters of Eq. (4), the voltage gain equation simplifies even further to $$A_v = -Z'_L/Z'_s \qquad \text{Eq. (10).}$$

As discussed below, several resonant circuits satisfy this equation for maximum voltage gain.

Examples

The following are examples of several multi-band LNA designed according to the present invention.

(a) A Concurrent Dual-Band CMOS LNA Topology

Figure 8:
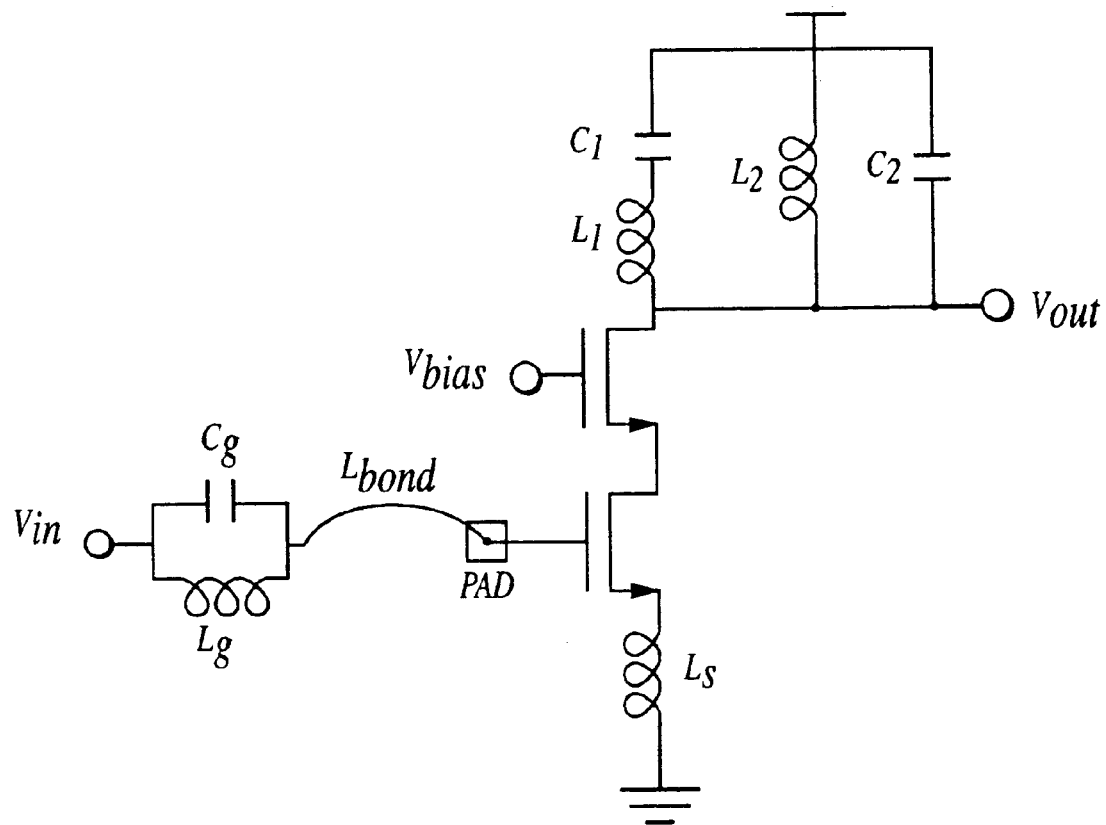
FIG. 8 is a schematic of a concurrent dual band CMOS LNA designed according to the present invention.

A large number of passive networks satisfy the design criteria of Equations 4, 5 and 10. In order to minimize the NF, one should maximize $Z_{gs}$, as previously mentioned. One way to obtain a reasonably large $Z_{gs}$, is to use a transistor with minimum channel length and no extra passive element between the gate and the source. Equation 5 can be satisfied using a single on-chip source degenerative inductor. FIG. 8 shows a concurrent dual-band CMOS LNA designed according to the criteria set forth above (with biasing not shown). In other to fulfill Equation 4 at both center frequencies, as shown, a parallel LC network in series with the inevitable inductance of the bonding wire and package lead is used. The parallel LC of $Z_g$ resonates with $Z_{gs} + Z_s$ at both frequency bands of interest such that Equation 4 is satisfied.

In order to achieve narrow-band gain at bands of interest, the drain load network should exhibit high impedance only at those frequencies. This can be done by adding a series LC branch in parallel with the parallel LC tank of a single-band LNA, as shown off the drain of the cascode transistor in FIG. 8. Each series LC branch introduces a zero in the gain transfer function of the LNA at its series resonant frequency.

It should be understood that this is but one topology that satisfies the above-derived equations for the design of a concurrent multi-band LNA. Many other topologies can be used.

(i) Concurrent Dual-Band LNA Measurement Results

A concurrent dual-band CMOS LNA operating at 2.45 GHz and 5.25 GHz frequency bands for indoor wireless communications was designed based on the topology of FIG. 8. This section presents the measurement results. It was implemented in a 0.35 μm BiCMOS technology using only CMOS transistors. The input parallel resonator uses Cg=0.9 pF porcelain multilayer capacitor and Lg=2.7 nH chip inductor. The inductance of the bonding wire, Lbond=3 nH and the source inductor, Ls=0.7 nH. Turning to the load network, the high impedance at each of the two frequencies is obtained by providing the series LC branch, C1=240 fF and L1=9.8 nH and the parallel LC tank, L2=2.3 nH and the inherent parasitic capacitance of the transistor, which is equivalent of to approximately 300 F.

Figure 9:
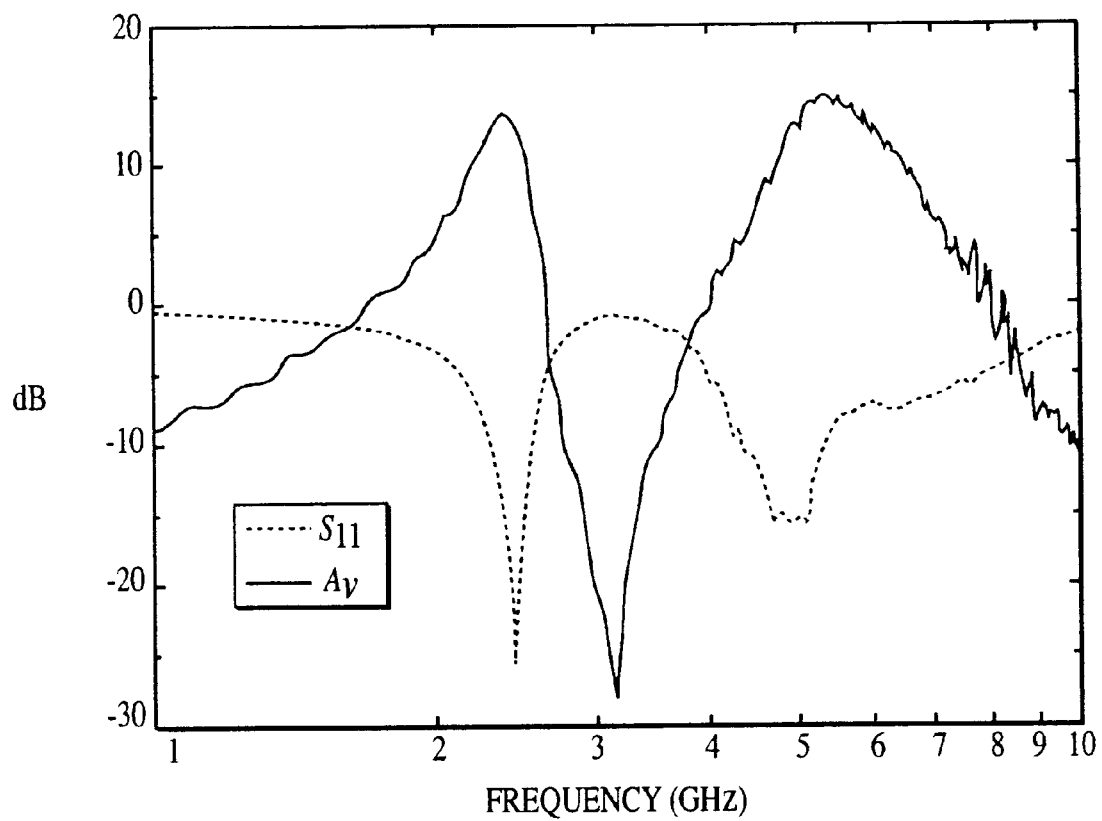
FIG. 9 is a graph showing the measured voltage gain and $S_{11}$ of the dual-band LNA shown in FIG. 8.

FIG. 9 shows the measured voltage gain, $A_v$, and input reflection coefficient, $S_{11}$, of the amplifier up to 10 GHz. It achieves narrow-band voltage gains of 14 dB and 15.5 dB, input return losses of 25 dB and 15 dB, and noise figures of 2.3 dB and 4.5 dB at 2.45 GHz and 5.25 GHz, respectively. It drains 4 mA of current from a 2.5 V supply voltage. The notch due to the LNA is about 40 dB deeper than the peaks which directly translated to the same amount of improvement in image rejection. Due to the large difference between the notch and pass-band frequencies, no elaborate tracking loops such as those proposed by Samavati et al. in "A 5-GHz CMOS Wireless LAN Receiver Front End" *IEEE JSSC*, vol. 35, no. 5, pp. 765–72, May, 2000, are necessary. The single-ended nature of the LNA makes external Baluns unnecessary. Measurements of 6 different chips with 3 different boards and off-chip components showed strong repeatability without using the commonly-used sliding capacitor input matching adjustment.

Figure 10:
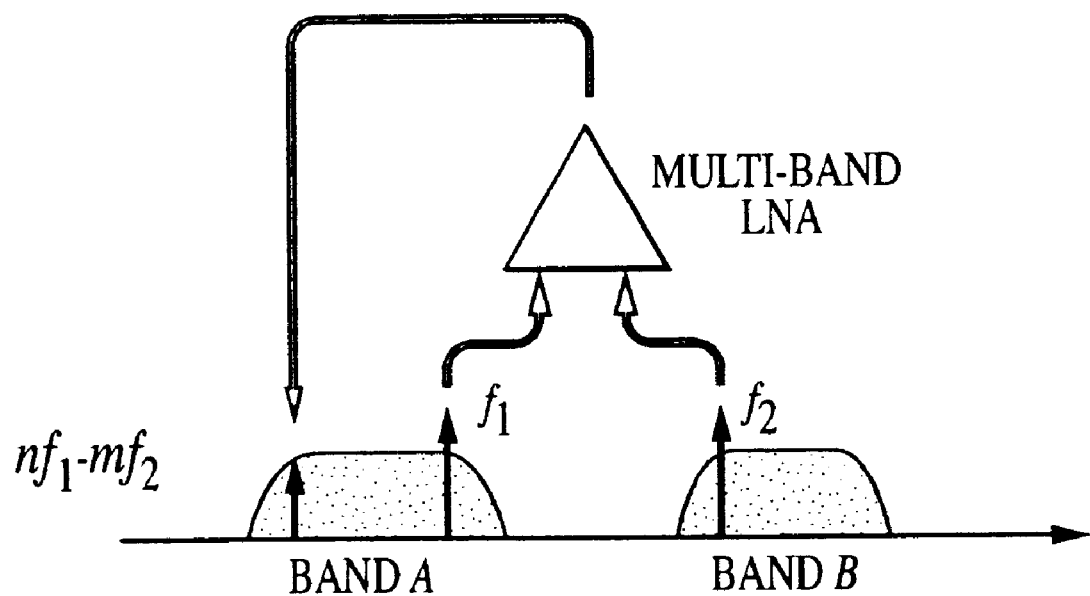
FIG. 10 is an illustration of the crossband intermodulation of a dual band LNA of the present invention.

An LNA's linearity is often measured by intermodulation and compression point tests and represented by IP3, for 3rd order non-linearity, and CP1 for 1 dB compression point. We refer to these in-band IP3 and CP1, as $IP3_{inband}$ and $CP1_{inband}$. However, in a multi-band system, more non-linearity measures should be considered. In-band signals from different desired bands (e.g., 2.50 GHz and 5.15 GHz) can mix due to amplifier's non-linearity, causing in-band undesired signals (e.g., 3×2.50−1×5.15=2.35 due to 4th order non-linearity), as shown in FIG. 10. The inventors showed this cross-band IPn, as $IPn_{crossband}$, where n is the order of non-linearity. A similar cross-band compression measure can be defined as the signal power in band A that causes a 1 dB drop in the small signal gain in band B and vice versa, which will be denoted as $CP1_{A>B}$.

This concurrent dual-band LNA demonstrates an input-referred in-band IP3 of 0 dBm and 5.6 dBm, and in-band CP1 of −8.5 dBm and −1.5 dBm at 2.45 GHz and 5.25 GHz bands, respectively. The measured input referred $IP4_{crossband}$ is 7.5 dBm. The LNA exhibits an $CP1_{2.4>5.2}$ of −11.5 dBm and an $CP1_{5.2>2.4}$ of −5.7 dBm.

Figure 11:
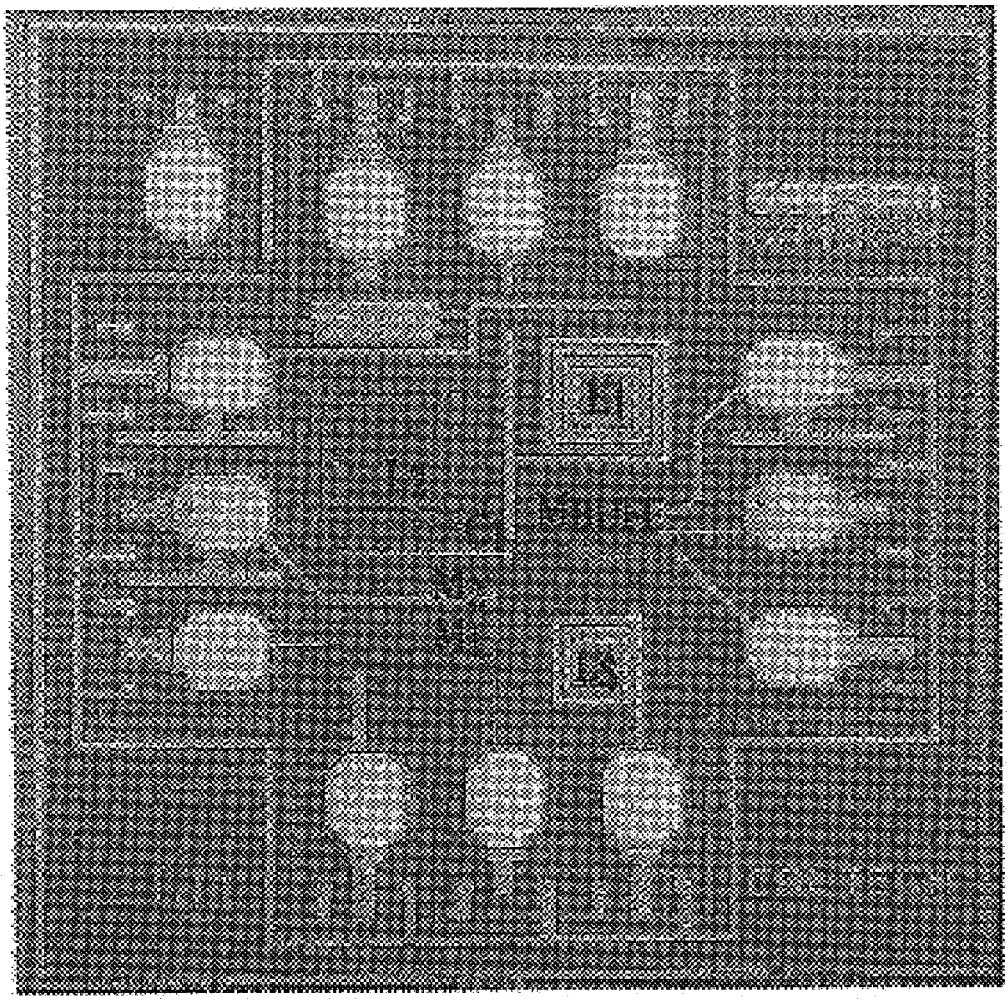
FIG. 11 is a micrograph of a concurrent dual band LNA designed according to the present invention.

The following table summarizes the measured performance of the fabricated monolithic concurrent dual-band LNA shown in FIG. 11. The chip occupies an area of 0.8×0.8 mm² including pads and ESDs. The NF, $S_{11}$ and power dissipation are better than previously published non-concurrent and/or single-band CMOS LNAs.

| frequency | 2.45 GHz ± 50 MHz | 5.25 GHz + 100 MHz |
|---|---|---|
| Voltage Gain | 14 dB | 15.5 dB |
| $S_{11}$ | −25 dB | −15 dB |
| NF | 2.3 dB | 4.5 dB |
| Input IP3 in-band | 0.0 dBm | 5.6 dBm |
| Input CP1 in-band | −8.5 dBm | −1.5 dBm |
| Input CP1 A>B | $CP1_{2.4>5.2}$=−11.5 dBm | $CP1_{5.2>2.4}$= −5.7 dBm |
| Input IP4 cross band | 7.5 dBm | |
| DC Current | 4mA | |
| Supply Voltage | 2.5 V | |
| Active Device | 0.35μm CMOS transistors | |

(b) A Concurrent Triple-Band LNA Topology

A concurrent triple-band LNA was designed and simulated according to the present invention. For simultaneous impedance matching, Equation 3 (and the subsequent equations) was simplified by ignoring $Z_g$, thus not obtaining the best NF possible. The following topology was chosen:

$$Z_{gs} = \frac{1}{sC_{gs}} \| \left(sL_{gs} + \frac{1}{sC_g}\right) = \frac{L_{gs}C_{gs}s^2 + 1}{sC_g\left(L_{gs}C_{gs}s^2 + 1 + \frac{C_{gs}}{C_s}\right)} \quad \text{Eq. 11}$$

$$Z_s = \frac{1}{sL_{s1}} + \left(sL_{s2} \| \frac{1}{sC_{s2}}\right) = \frac{sL_{s2}\left(L_{s1}C_{s2}s^2 + 1 + \frac{L_{s1}}{L_{s2}}\right)}{L_{s2}C_{s2}s^2 + 1}. \quad \text{Eq. 12}$$

If we set (1) $L_{gs}C_{gs}=L_{s1}C_{s2}$; (2) $L_{gs}C_g=L_{s2}C_{s2}$; and (3) $C_{gs}/C_g=L_{s1}/L_{s2}$, then, for purposes of Equation 5, $Z_{gs}Z_s= L_{s2}/C_g=L_{s1}/C_{gs}$. Then, setting $Z_{gs}+Z_s=0$ at all three frequency bands (satisfying modified Eq. 4), we obtain $Z_{in}= g_m(L_{s2}/C_g)=g_m(L_{s1}/C_{gs})$.

Focusing on the load network, to achieve a high gain, $A_v$, at each of the three frequencies of interest, $\omega_1$, $\omega_2$, $\omega_3$, we have:

$$\omega_1^2 \times \omega_2^2 \times \omega_3^2 = 1/L_P C_P L_1 C_1 L_2 C_2 \quad \text{Eq. 13;}$$

$$\omega_1^2 + \omega_2^2 + \omega_3^2 = 1/L_P C_P + 1/L_1 C_1 + 1/L_2 C_2 + 2/L_1 C_P + 1/L_2 C_P \quad \text{Eq. 14}$$

$$1/\omega_1^2 + 1/\omega_2^2 + 1/\omega_3^2 = L_P C_P + L_1 C_1 + L_2 C_2 + L_P C_1 + L_P C_2; \quad \text{Eq. 15;}$$

where $C_P$ and $L_P$ are in parallel and chosen for the gain at the first band, $L_1$ and $C_1$ are in series and whose values are chosen to maximize the gain at the second band and $C_2$ and $L_2$ are for the third band.

(i) Simulated Measurement Results

Figure 12:
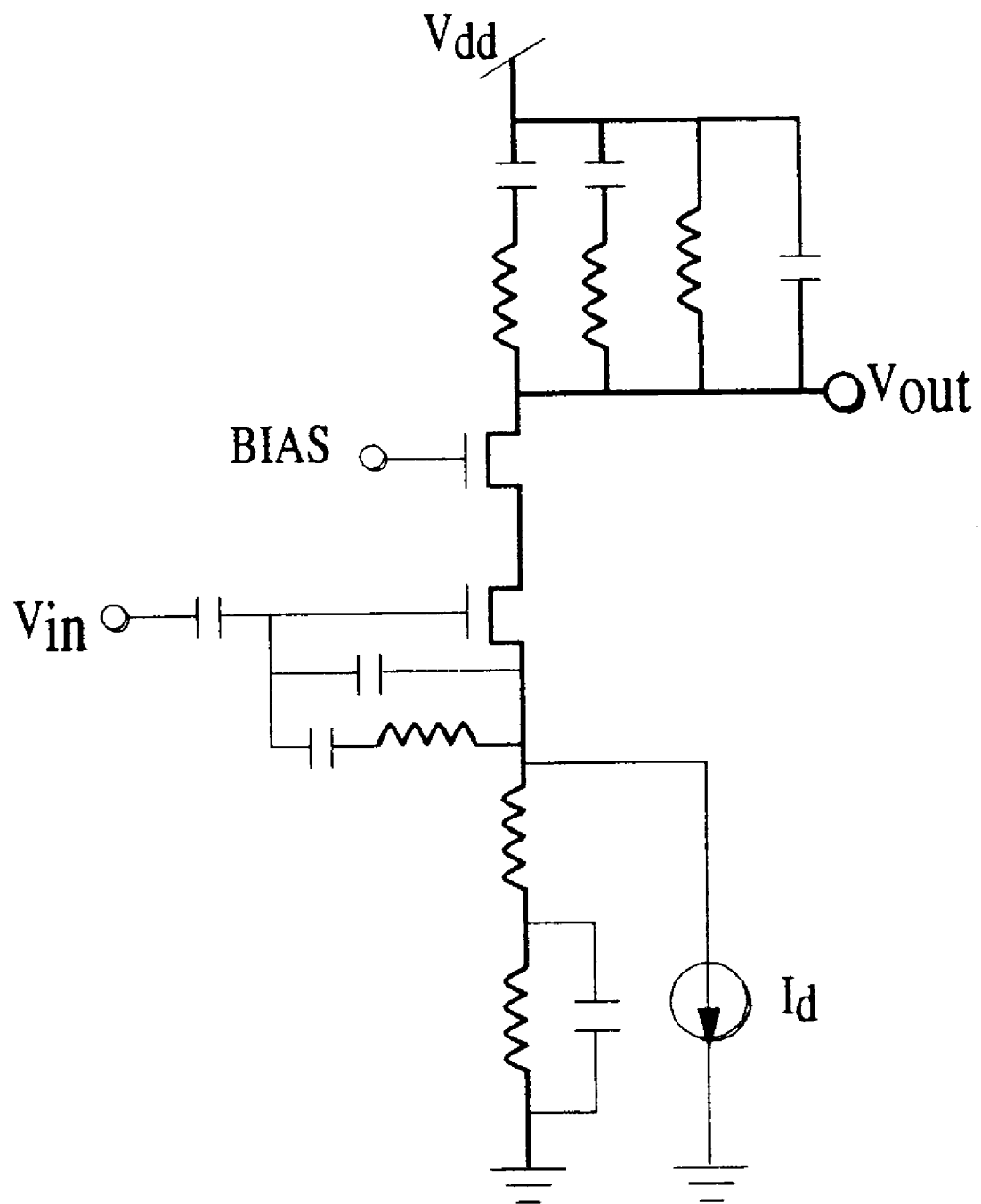
FIG. 12 is a schematic of a concurrent triple band LNA topology designed according to the present invention.

A concurrent triple-band 0.35 mm BiCMOS LNA operating at 0.9 GHz. 2.45 GHz and 5.25 GHz frequency bands was simulated according these parameters and is shown in FIG. 12. In this example, $V_{dd}$=3 v, $I_d$=3 mA, $S_{11}$=−12 dB, and $A_v$=10 dB.

Having thus described exemplary embodiments of the invention, it will be apparent that further alterations, modifications, and improvements will also occur to those skilled in the art. Further, it will be apparent that the present technique and system is not limited to use with an LNA. The simultaneous input matching and load techniques of the present invention may also be used to design other types of amplifiers and active filters. Further, this invention provides a basis for designing a concurrent multiband LNA at theoretically any number of frequency bands.

We claim:

1. A concurrent dual band LNA, having an input and an output that operates simultaneously at 2.45 GHz and 5.25 GHz center frequency bands, comprising:

(a) a CMOS transistor disposed on a semiconductor substrate and having a gate, g, a drain, d, a source, s, and a characteristic transconductance, $g_m$, (b) an input impedance network, Zin, that simultaneously and independently matches the frequency-dependent input impedance of the transistor to a 50 ohm characteristic impedance at center frequencies of 2.45 GHz and 5.25 GHz, and defined by the equations:

$$Z_{in}=Z_g+Z_{gs}+Z'_s+g_mZ'_sZ_{gs}=50\ \Omega \text{ and } Z_g+Z_{gs}+Z'_s=0$$

wherein:

(i) $Z_g$ is an input parallel resonator having a capacitor in parallel with an inductor, disposed between the LNA input and gate and with a wire bonded to the gate, (ii) $Z_{gs}$ is the impedance between the gate and source, and (iii) $Z'_s$ is an inductor disposed between the source and AC ground; and (c) an output load network, $Z_L$, that simultaneously provides a voltage gain, $A_v$, to an input signal at the LNA input at the 2.45 GHz and 5.25 GHz center frequencies, wherein the output load network, $Z_L$, is a series LC branch circuit, in parallel with a parallel LC tank circuit.

2. The concurrent LNA of claim 1 wherein the input parallel resonator is an approximately 0.9 pF capacitor in parallel with an approximately 2.7 nH inductor with the wire boding having an approximate inductance value of 3 nH.

3. The concurrent LNA of claim 1 wherein $Z'_s$ is an approximately 0.7 nH inductor.

4. The concurrent LNA of claim 1 wherein the series LC branch circuit is an approximately 240 fF capacitor in series with an approximately 9.8 nH inductor.

5. The concurrent LNA of claim 1 wherein the parallel LC tank circuit is an approximately 2.3 nH inductor in parallel with the inherent parasitic inductance of the active device.

6. The LNA of claim 1 wherein the voltage gain, Av, is defined by the equation $Av=Z_L/Z'_s$.

7. The LNA of claim 6 wherein the output load network is a multi resonant load circuit disposed between the output of the three terminal device and ac ground that provides the voltage gain of the device at each of the discrete frequency band.

8. A concurrent dual band LNA, having an input and an output that operates simultaneously at 2.45 GHz and 5.25 GHz center frequency bands, comprising:
   (a) a CMOS transistor disposed on a semiconductor substrate and having a gate, g, a drain, d, a source, s, and a characteristic transconductance, $g_m$
   (b) an input impedance network, Zin, that simultaneously and independently matches the frequency-dependent input impedance of the transistor to a 50 ohm characteristic impedance at center frequencies of 2.45 GHz and 5.25 GHz, and defined by the equations:

$$Z_{in} = Z_g + Z_{gs} + Z'_s + g_m Z'_s Z_{gs}, = 50$$

and $Z_g + Z_{gs} + Z'_s = 0$ wherein:

(i) $Z_g$ is an input parallel resonator having a capacitor in parallel with an inductor, disposed between the LNA input and gate and with a wire bonded to the gate,
   (ii) $Z_{gs}$ is the impedance between the gate and source, and
   (iii) $Z'_s$ is an inductor disposed between the source and AC ground; and
   (c) an output load network, $Z_L$, that simultaneously provides a voltage gain, $A_V$, to an input signal at the LNA input at the 2.45 GHz and 5.25 GHz center frequencies, wherein the output load network, $Z_L$, is a series LC branch circuit, in parallel with a parallel LC tank circuit; and wherein
   the input parallel resonator is an approximately 0.9 pF capacitor in parallel with an approximately 2.7 nH inductor with the wire boding having an approximate inductance value of 3 nH,
   $Z'_s$ is an approximately 0.7 nH inductor,
   the series LC branch circuit is an approximately 240 fF capacitor in series with an approximately 9.8 nH inductor, and
   the parallel LC tank circuit is an approximately 2.3 nH inductor in parallel with the inherent parasitic inductance of the active device.

9. A monolithic, concurrent dual band low noise amplifier (LNA) having an input and output, comprising:
   (a) a three terminal active device with a characteristic transconductance, $g_m$, and having a control input terminal, an output terminal, and a current source terminal, the device being disposed on a semiconductor substrate,
   (b) an input impedance matching network system, $Z_{in}$, associated with the active device that simultaneously and independently matches the frequency-dependent input impedance of the active device to a predetermined characteristic impedance at two discrete frequency bands, and defined by the equation:

$$z_{in} = Z_g + Z_{gs} + Z'_s + g_m Z'_s Z_{gs},$$

wherein $Z_g$ is a series impedance disposed between the LNA input and the control input terminal of the active device, $Z_{gs}$ is the impedance between the control input and current source terminals, and $Z'_s$ is the sum of the impedance between the current source terminal of the active device and ac ground, $Z_s$, and the intrinsic current source to bulk impedance, $Z_{bs}$;
   (c) an output load network, $Z_L$, that simultaneously provides a voltage gain, $A_V$, to an input signal at the LNA input at each of the two discrete frequency bands, wherein $Z_g + Z_{gs} + Z'_s = 0$ and $g_m Z'_s Z_{gs}$ equals the predetermined characteristic impedance, characteristic impedance and thus $Z_{in} = 50$ ohms, and $Z_g$ is a parallel LC network wire bonded to the input of the three terminal device and $Z'_s$ is an inductor.

10. The LNA of claim 9 wherein $Z_{in}$ further comprises a second two terminal, frequency dependent, impedance network disposed between the input of the active device and ac ground and defined by the equation:

$$Z_2 = Z'_L + Z_f,$$

wherein $Z'_L$ is the sum of the load impedance between the output and ac ground, $Z_L$, and the intrinsic output terminal to bulk impedance, $Z_{bd}$, and $Z_f$ is the feedback between the output terminal and control input terminal.

11. The LNA of claim 9 wherein $Z_{in}$ further comprises a second two terminal, frequency dependent, impedance network disposed between the input of the active device and ac ground and defined by the equation:

$$Z_3 = [1 + Z_f/Z'_L]/g_{mb},$$

wherein $g_{mb}$ is the bulk effect transconductance.

12. The LNA of claim 9 wherein $Z_{in}$ further comprises a second two terminal, frequency dependent, impedance network disposed between the input of the active device and ac ground and defined by the equation:

$$Z_4 = \frac{1}{g_m - g_{mb}} \cdot \left(\frac{Z_f}{Z'_L}\right) \cdot \frac{Z_{gs} + Z'_s(1 + g_m Z_{gs})}{Z_{gs}}.$$

13. The LNA of claim 9 wherein $Z_{in}$ further comprises a second two terminal, frequency dependent, impedance network disposed between the input of the active device and ac ground, which is the intrinsic control terminal to bulk impedance, $Z_{gb}$.

14. A monolithic, concurrent dual band low noise amplifier (LNA) having an input and output, comprising:
   (a) a three terminal active device with a characteristic transconductance, $g_m$, and having a control input terminal, an output terminal, and a current source terminal, the device being disposed on a semiconductor substrate,
   (b) an input impedance matching network system, $Z_{in}$, associated with the active device that simultaneously and independently matches the frequency-dependent input impedance of the active device to a predetermined characteristic impedance at two discrete frequency bands, and defined by the equation:

$$z_{in} = Z_g + Z_{gs} + Z'_s + g_m Z'_s Z_{gs},$$

wherein $Z_g$ is a series impedance disposed between the LNA input and the control input terminal of the active device, $Z_{gs}$ is the impedance between the control input and current source terminals, and $Z'_s$ is the sum of the impedance between the current source terminal of the active device and ac ground, $Z_s$, and the intrinsic current source to bulk impedance, $Z_{bs}$;
   (c) an output load network, $Z_L$, that simultaneously provides a voltage gain, $A_V$, to an input signal at the LNA input at each of the two discrete frequency bands, wherein $Z_g + Z_{gs} + Z'_s = 0$ and $g_m Z'_s Z_{gs}$ equals the predetermined characteristic impedance, characteristic impedance and thus $Z_{in} = 50$ ohms, and $Z_g$ is a parallel LC network wire bonded to the input of the three terminal device and $Z'_s$ is an inductor and the output load network, $Z_L$, is a series LC branch in parallel with a parallel LC tank.

15. A monolithic, concurrent multi band low noise amplifier (LNA) having an input and output, comprising:
(a) a three terminal active device with a characteristic transconductance, $g_m$, and having a control input terminal, an output terminal, and a current source terminal, the device being disposed on a semiconductor substrate;
(b) an input impedance matching network system, $Z_{in}$, defined by the equation, $Z_{in}=Z_1+Z_2+Z_3+Z_4+Z_5$, that simultaneously and independently matches the frequency dependent input impedance of the three terminal active device to a predetermined characteristic impedance at two or more discrete frequency bands while minimizing the noise associated with the active device;
(c) an output load network, $Z_L$, that simultaneously provides a voltage gain, $A_V$, to an input signal at the LNA input at each of the two or more discrete frequency bands; and wherein
 (i) $Z_1$ is a first two-terminal, frequency-dependent, impedance network disposed between the input of the active device and ac ground and defined by the equation:

$Z_1 = Z_g + Z_{gs} + Z'_s + g_m Z'_s Z_{gs}$ wherein $Z_g$ is a series impedance disposed between the LNA input and the control input terminal of the active device, $Z_{gs}$ is the impedance between the control input and current source terminals and $Z'_s$ is the sum of the impedance between the current source terminal of the active device and ac ground, $Z_s$, and the intrinsic current source-to-bulk impedance, $Z_{bs}$;
 (ii) $Z_2$ is a second two-terminal, frequency-dependent, impedance network disposed between the input of the active device and ac-ground and defined by the equation:

$Z_2 = Z'_L + Z_f$ wherein $Z'_L$ is the sum of the load impedance between the output and ac ground, $Z_L$, and the intrinsic output terminal-to-bulk impedance, $Z_{bd}$, and $Z_f$ is the feedback between the output terminal and control input terminal;

(iii) $Z_3$ is a third two-terminal, frequency-dependent, impedance network disposed between the input of the active device and ac-ground and defined by the equation:

$Z_3 = [1 + Z_f/Z'_L]/g_{mb}$, wherein $g_{mb}$ is the bulk effect transconductance;
 (iv) $Z_4$ is a fourth two-terminal, frequency-dependent, impedance network disposed between the input of the active device and ac-ground and defined by the equation:

$$Z_4 = \frac{1}{g_m - g_{mb}} \cdot \left(\frac{Z_f}{Z'_L}\right) \cdot \frac{Z_{gs} + Z'_s(1 + g_m Z_{gs})}{Z_{gs}}; \text{ and}$$

(v) $Z_5$ is a fifth two-terminal, frequency-dependent impedance network disposed between the input of the active device and ac ground, which is the intrinsic control terminal-to-bulk impedance $Z_{gb}$.

16. The multi band LNA of claim 15, wherein $Z_f$ and $Z_{gb}$ are neglected, thereby simplifying the input impedance matching network system to $Z_{in}=Z_1$.

17. The LNA of claim 16, further having a characteristic noise factor, F, approximated by the equation:

$$F \approx 1 + \frac{\gamma g_{d0}}{Y_s} \cdot \frac{1}{g_m^2 |Z_{gs}|^2} |1 + Y_s(Z_{gs} + Z'_s + Z_g)|^2,$$

and wherein $Z_{in}$ is matched to the predetermined characteristic impedance and F is minimized by setting $Z_{gs}+Z'_s+Z_g=0$ for the center frequency of each of the two or more discrete frequency bands.

18. The LNA of claim 17, wherein the predetermined characteristic impedance and thus $g_m Z'_s Z_{gs}$ equals 50 ohms.

19. The LNA of claim 17, wherein the voltage gain, Av, is defined by the equation $Av = -Z_L/Z'_s$.

20. The LNA of claim 19, wherein the output load network is a multi-resonant load circuit disposed between the output of the three terminal device and ac ground that provides the voltage gain of the device at each of the discrete frequency band.

* * * * *